United States Patent [19]

Eidschun

[11] 4,443,304

[45] Apr. 17, 1984

[54] PLATING SYSTEM AND METHOD

[75] Inventor: Charles D. Eidschun, Clearwater, Fla.

[73] Assignee: Micro-Plate, Inc., Clearwater, Fla.

[21] Appl. No.: 432,186

[22] Filed: Oct. 1, 1982

[51] Int. Cl.³ .................... C25D 5/08; C25D 21/20
[52] U.S. Cl. .................................. 204/27; 204/222; 204/273
[58] Field of Search ........................ 204/27, 222, 273

[56] References Cited

U.S. PATENT DOCUMENTS

| | | | |
|---|---|---|---|
| 1,431,022 | 10/1922 | Mumford | 204/273 |
| 3,271,290 | 9/1966 | Ranowski | 204/222 |
| 3,796,646 | 3/1974 | Zambon | 204/222 |
| 4,174,261 | 11/1979 | Pellegrino | 204/273 |
| 4,372,825 | 2/1983 | Eidschun | 204/273 |

*Primary Examiner*—T. M. Tufariello
*Attorney, Agent, or Firm*—Jack E. Dominik

[57] ABSTRACT

Disclosed is a plating module and method in a cell which has linearly spaced vertical anodes, and intermediately positioned spargers which can be angularly adjusted with their nozzles impinging directly or at an acute angle on the printed circuit boards positioned at a mid-point in each cell. The printed circuit boards are suspended in clamped relationship to a cathode bar. The cathode bar, in turn, in each unit is coupled to a reciprocating power drive so that the same will move back and forth an optimum distance of at least the spacing between an anode and a sparger, or more particularly, half the spacing between two spargers. The method of the invention contemplates positioning boards to be plated, whether with copper or tin, interiorly of the unit in which the boards are reciprocated in agitation relationship with a plating solution into which an anodes are positioned. The boards are then permitted to reciprocate for a given period of time with a preselected current density. Thereafter they are removed and cleansed, and subsequently positioned into another reciprocatory-type unit for further plating and concluding the cycle. Desirably vertically staggered turbulent free jets are employed angled to accomplish a maximized mass transfer of solution onto the printed circuit boards. In a given embodiment, flow rates can be between 100 and 300 gallons per minute, and current densities between 50 and 200 amperes per square foot.

7 Claims, 9 Drawing Figures

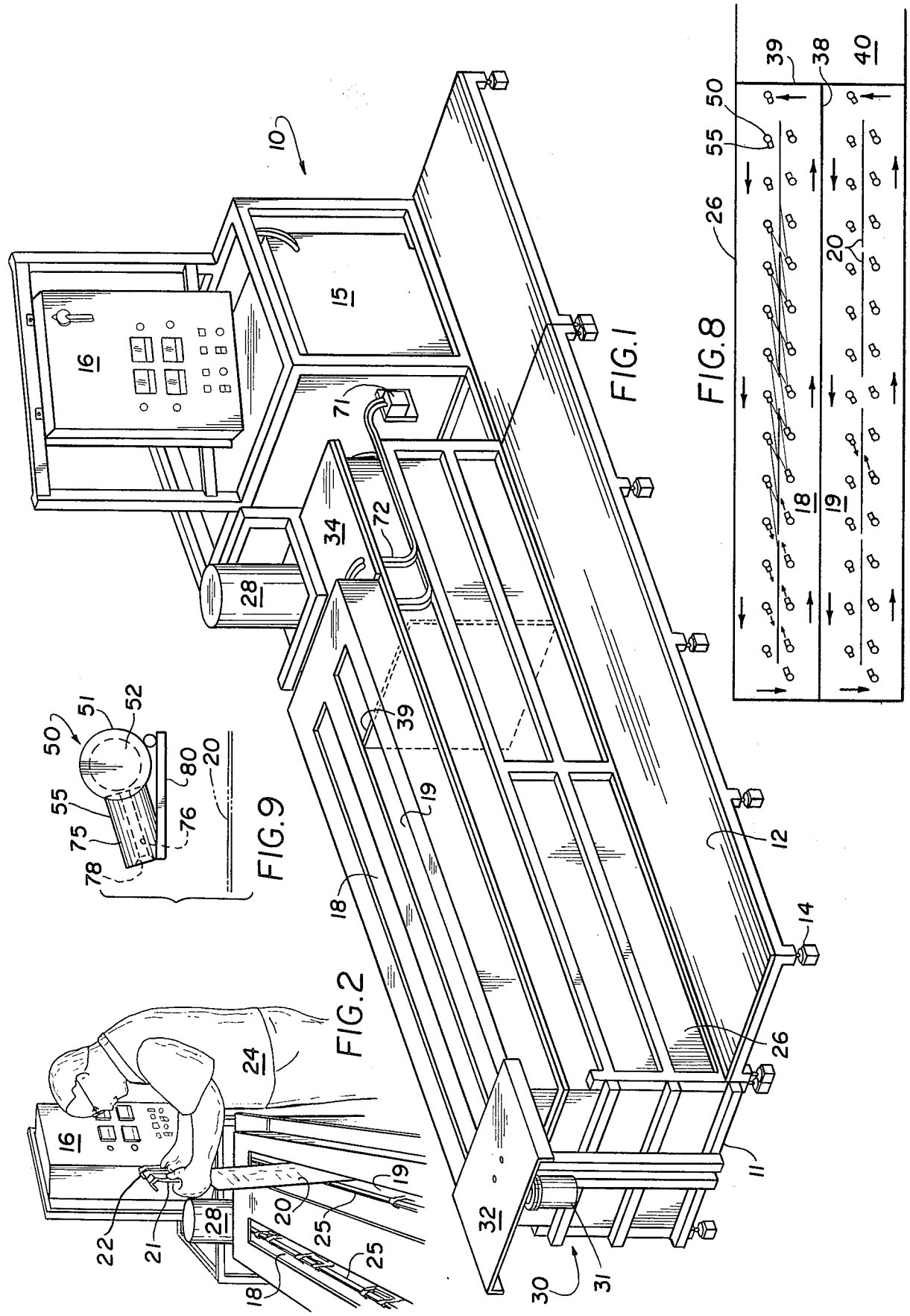

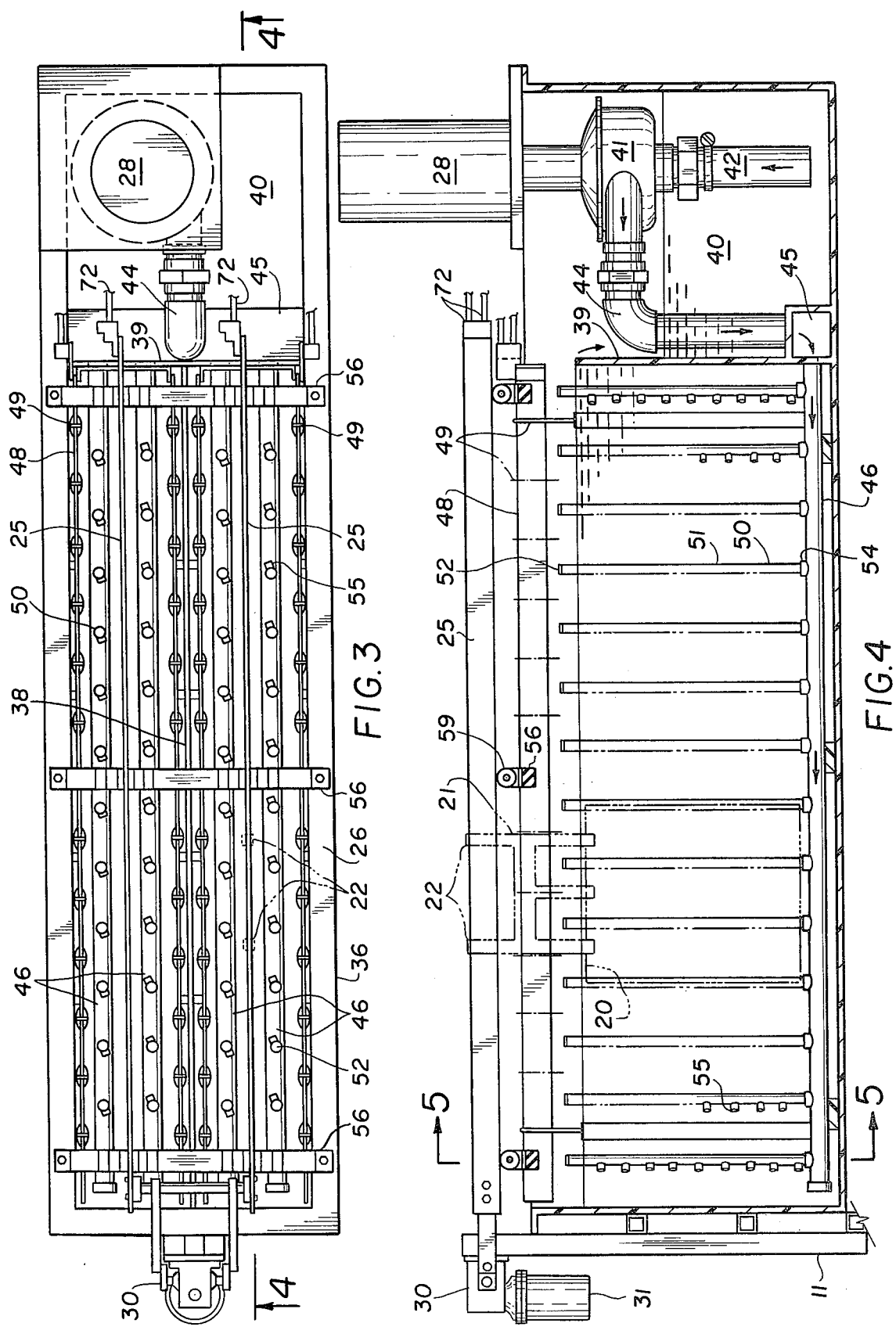

PLATING SYSTEM AND METHOD

FIELD OF INVENTION

The present invention is directed to a plating system and method, and one that finds particular utility in the processing of printed circuit boards.

SUMMARY OF THE PRIOR ART

In the processing of printed circuit boards, the same are covered with photoresist on a conductive substrate, and thereafter normally copper is plated in the areas where the photoresist does not appear. Subsequently a tin-lead deposit may be coated on top of the copper.

The processing of printed circuit boards can be handled automatically in equipment such as exemplified by applicant's copending Pat. application Ser. No. 197,073 filed Oct. 15, 1980. These machines produce excellent result, but oftentimes a system which is fully automated will utilize over 60 feet in length in factory space, some 15 feet wide. Furthermore the cost in 1982 dollars can be as high as $500,000.

It is highly desirable for factory operations where the demand is less, and where quality operators are employed, for a lesser capital intensive type plating system. Such systems will normally use three modules. The first module will apply copper to the printed surface board, the second module will apply tin-lead to the printed circuit board. Independently of the modules 1 and 2 just described, a third module for purposes of cleaning the boards is supplied. These are often positioned in a U-shaped configuration, so that one operator can handle the boards. It is to this type system, made possible by the present invention, that the specific construction and method of the invention is directed.

SUMMARY

The present invention is directed to a plating module and method in a cell which has linearly spaced vertical anodes, and intermediately positioned spargers which can be angularly adjusted with their nozzles impinging directly or at an acute angle on the printed circuit boards positioned at a mid-point in each cell. The printed circuit boards are suspended in clamped relationship to a cathode bar. The cathode bar, in turn, in each unit is coupled to a reciprocating power drive so that the same will move back and forth an optimum distance of at least the spacing between an anode and a sparger, or more particularly, half the spacing between two spargers. The method of the invention contemplates positioning boards to be plated, whether with copper or tin, interiorly of the unit in which the boards are reciprocated in agitation relationship with a plating solution into which an anodes are positioned. The boards are then permitted to reciprocate for a given period of time with a preselected current density. Thereafter they are removed and cleansed, and subsequently positioned into another reciprocatory-type unit for further plating and concluding the cycle. Desirably vertically staggered turbulent free jets are employed angled to accomplish a maximized mass transfer of solution onto the printed circuit boards. In a given embodiment, flow rates can be between 100 and 300 gallons per minute, and current densities between 50 and 200 amperes per square foot.

In view of the foregoing it is a principal object of the present invention to provide an economical plating station which optimally can plate eight printed circuit boards (18"W×24"L).

A related object of the present invention is to provide a plating unit which, in multiples, can be handled by a single operator to perform two plating operations on a single printed circuit board which will process up to thirty-two panels per hour by a single operator. The operator thus can process four cycles per hour of eight boards each This contrasts with the fully automated unit which may process forty boards in the same period of time.

Yet another object of the present invention is to provide a plating module with the reciprocatory mounting of the boards in which the current density in separate cells can be independently actuated and controlled; in which the speed of reciprocation can be controlled; and in which product can be loaded and unloaded irrespective of continuing processing in a portion of the batch Yet another object of the present invention is to provide independent processing stations which minimize leakage and consumption of plating solution and which are economical to purchase.

DESCRIPTIVE DRAWINGS

Further objects and advantages of the present invention will become apparent as the following description of an illustrative embodiment proceeds taken in conjunction with the accompanying drawings, in which:

FIG. 1 is a perspective view of an illustrative plating station showing two parallel adjacent plating cells;

FIG. 2 is a partially diagrammatic view showing how the printed circuit boards are removed and inserted into a two cell type unit such as illustrated in FIG. 1;

FIG. 3 is a top view of the plating station with the cover removed;

FIG. 4 is a partially diagrammatic, partially broken longitudinal sectional view of FIG. 3 taken along line 4—4 of FIG. 3;

FIG. 8 is a partially diagrammatic top view showing the flow pattern created by the spargers in a given plating cell; and FIG. 9 is a view of the sparger nozzle and deflector plate taken from the top of the sparger pipe.

GENERAL REVIEW

Figure 5:
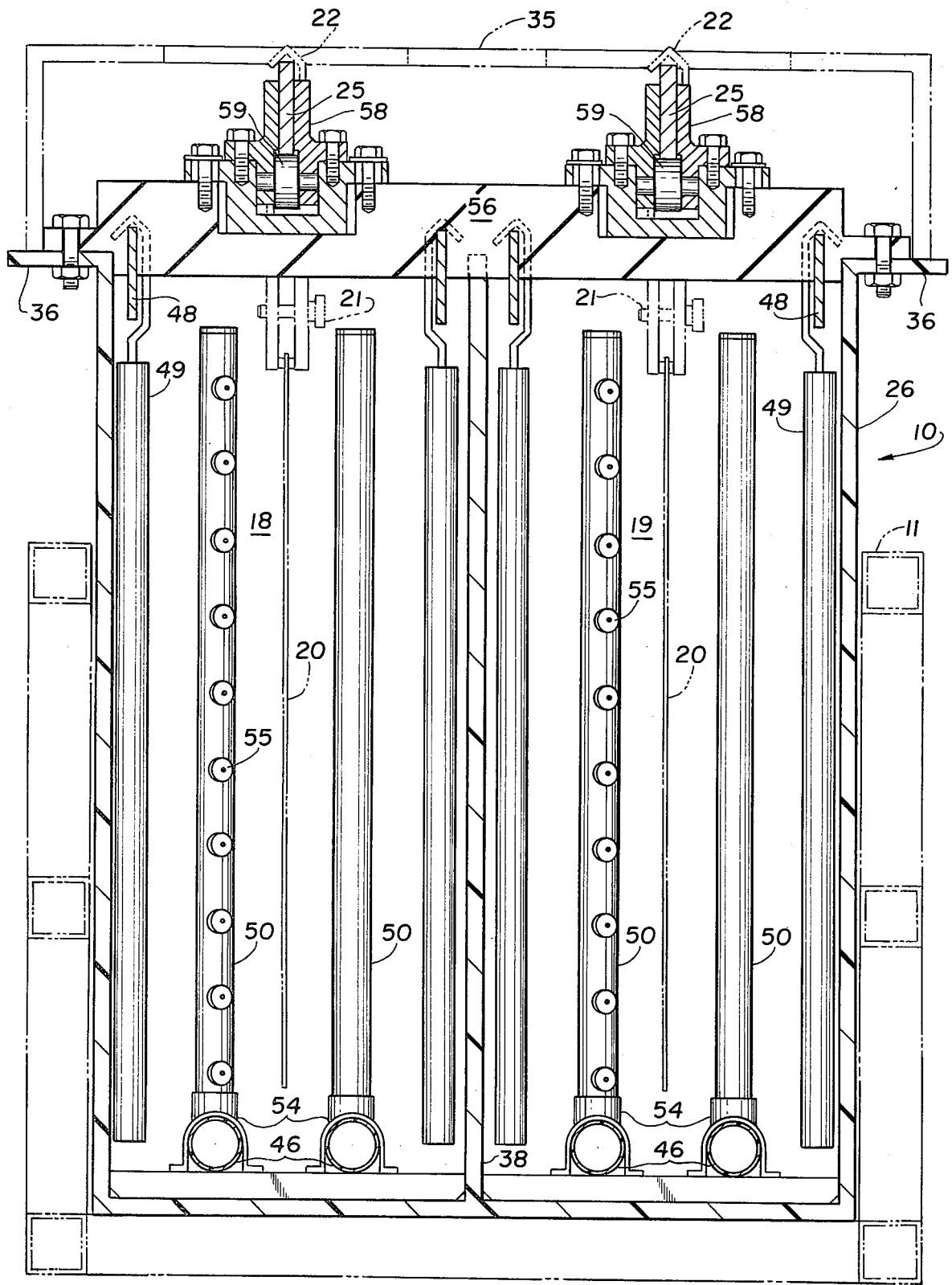
FIG. 5 is a transverse sectional view taken essentially along section line 5 of FIG. 4, but in enlarged scale.

As pointed out above, and as will be specified in detail below, the present invention is exemplified in an ABC assembly in which module A is divided into two cells for plating eight printed circuit boards with copper at one time. Module B is similarly provided with the capability of applying tin lead to printed circuit boards, but with one-third the time dwell as the copper unit. A third cell is provided for purposes of cleaning the printed circuit boards in preparation for electroplating or otherwise treating them inbetween the copper and the tin lead processing. Each of the units will normally contain 200 to 300 gallons of a given plating solution which is repeatedly used and monitored for concentration at least on a daily basis. The units have one or two cells, each of which is actuated by separate rectifiers so that if one-half of the cell is the subject of the removal of printed circuit boards, the other half will continue to plate. The same is true upon loading, so that the time cycle for half of the boards being processed can be accurately controlled. A pump is positioned vertically in one end of the tank and immersed in the solution.

Both sides of the processing unit use the same pump and therefore the flow rates are equal. The fluid concentrations are also the same. As pointed out above however, both sides are electrochemically independent for purposes of current supply and therefore can be loaded and unloaded independent of each other.

The cathode bar reciprocates in rollers. The stroke is ideally the distance between the center of a sparger and the center of an adjacent anode. Where the anodes are sequentially positioned up near the wall portion of the cells, and the spargers are positioned between the anodes and the printed circuit board, then the extent of reciprocation is ideally half the distance between the spargers. This results in a relatively uniform application of fluid turbulence on the printed circuit boards, and plating current densities will be uniform within ±15%.

In the method, if only two boards are being plated, one or more dummy blanks are used. If three boards are being plated, but less than a full load, the active panels are adjacent each other with the dummy on one end of the other. The speed of reciprocation is controlled by the operator to an optimum between rapid reciprocation, and that speed of reciprocation which permits the operator to grasp a printed circuit board and insert or remove the same from the cell for further processing, while the printed circuit boards in the adjacent parallel cell continue to be processed.

As a result of the structure to be described, plating of printed circuit boards at higher than conventional current densities may be achieved. This follows from plating in a cell which utilizes a sparger system employing turbulent free jet agitation, on staggered locations, to increase the ion supply and allow increased plating rates due to higher current densities and efficiency (metal ion supply). Further, the agitation is increased by the cathode movement, shown as reciprocation, which also provides uniformity between the turbulent free jets and averaging the anode exposure. By utilizing the reciprocating cathode, movement is achieved in a much smaller station at a lesser capital investment than continuous processing. The turbulent free jets are angled at the printed circuit board, which printed circuit board is reciprocated, to entrain the fluid to form a cone of agitation. Uniform agitation follows from equal distribution of the fluid through the sparger system, and a plurality of jets or agitations cones intersected by the printed circuit board. The cathode agitation by way of reciprocation further increases the uniformity of agitation and thereby upgrades the uniformity of plating.

Another factor to be considered is that the subject method as well as the apparatus is intended for plating printed circuit boards through the holes that are provided therein. It is highly desirable to have the plating thickness on the cylindrical interior of the holes substantially the same as the thickness on the surface. The opposite flow as well as the agitation encourages the flow of solution through the holes in the printed circuit board, due to a viscosity effect. This increases the mass transfer through the holes to allow more ions for plating. Ideally the metal plated on the surface of the printed circuit board should be of the same thickness as the hole. Such results are achieved in the method and with the apparatus disclosed.

Turning now to FIG. 1, it will be seen that a plating station 10 is shown which is housed by a support frame 11. Extending from the lower portion is a catwalk 12 for the operator, the catwalk 12 and the support frame 11 being floor leveled by adjustable feet 14. At one end of the unit provision is made for a rectifier 15, and control 16. As shown in FIG. 1, there is a rear plating cell 18 and a front plating cell 19, which in this instance are substantially the same. The printed circuit board 20, as shown in FIG. 2, is secured to a plating rack 21 having a cathode hook 22 at the upper portion. The operator in loading and unloading the plating station 10, places the printed circuit board and its associated plating rack 21 and cathode hook 22 over the cathode bar 25. Thereafter the cathode bar reciprocates, and the printed circuit board 20 reciprocates within the tank 26. The tank 26 includes a pump motor 28 which drives the fluid in a manner to be described hereinafter.

At the end of the plating station 10 remote from the rectifier 15, the oscillating drive assembly 30 is positioned. It includes the oscillating drive motor 31, and a drive cover 32. Back to the opposite end of the plating station 10, provision is made for a sump cover 34. The entire tank, in turn, is overlayed and shielded by a tank cover 35 which has two slots in it to provide entry into the rear plating cell 18, and the front plating cell 19. The two plating cells 18, 19 are divided by a center wall 38. This is best shown in FIGS. 3 and 4. Also to be noted is the wier end 39 of the tank 26 which walls off the sump 40 from the balance of the interior of the tank 26 and its respective plating cells 18, 19.

A sump pump 41 is driven by the pump motor 28 and fluid from the sump conveyed through the pump inlet 42 is driven by the pump 41 into the pump outlet 44. Thereafter the pump outlet 44 diverts into a pump manifold 45. The pump manifold 45 is shown in FIGS. 3 and 4, runs transversely of the plating station 10. Extending longitudinally along the plating station 10 are shown here four sparger manifolds 46.

To be noted particularly in FIG. 3, an anode bus 48 is provided from which a plurality of anodes 49 are hung. Also to be noted in FIG. 3 is the alternate spacing between the spargers 50 and the anodes 49. The spargers 50, as shown in FIG. 4, are made up of individual pipes 51 having caps 52 at their top, and being secured by means of pipe joint 54 to the sparger manifold 46. The caps 52 are provided on the sparger pipes 51 so that access can be had for cleaning whenever required.

Each sparger pipe has a plurality of nozzles 55, staggered at mid-center positions between the adjacent units. That is one sparger unit may have the spargers one inch above the sparger manifold, and if the nozzle spacing is two inches, the next sparger will have the lowest nozzle two inches above the manifold.

Turning now to FIG. 5, it will be seen that cross bars 56 are provided transversely along the top of the tank 26, and each cross bar has mounted thereon one or more cathode guides 58, the cathode guides 58 being opposed members which flank the cathode bar 25. The cathode bar 25, in turn, reciprocates on a plurality of cathode rollers 59. It will be appreciated that all members supporting the cathode bar 25 are insulated so that the cathode, which remains heavily energized, can transfer its current directly to the plating rack 21.

Figure 6:
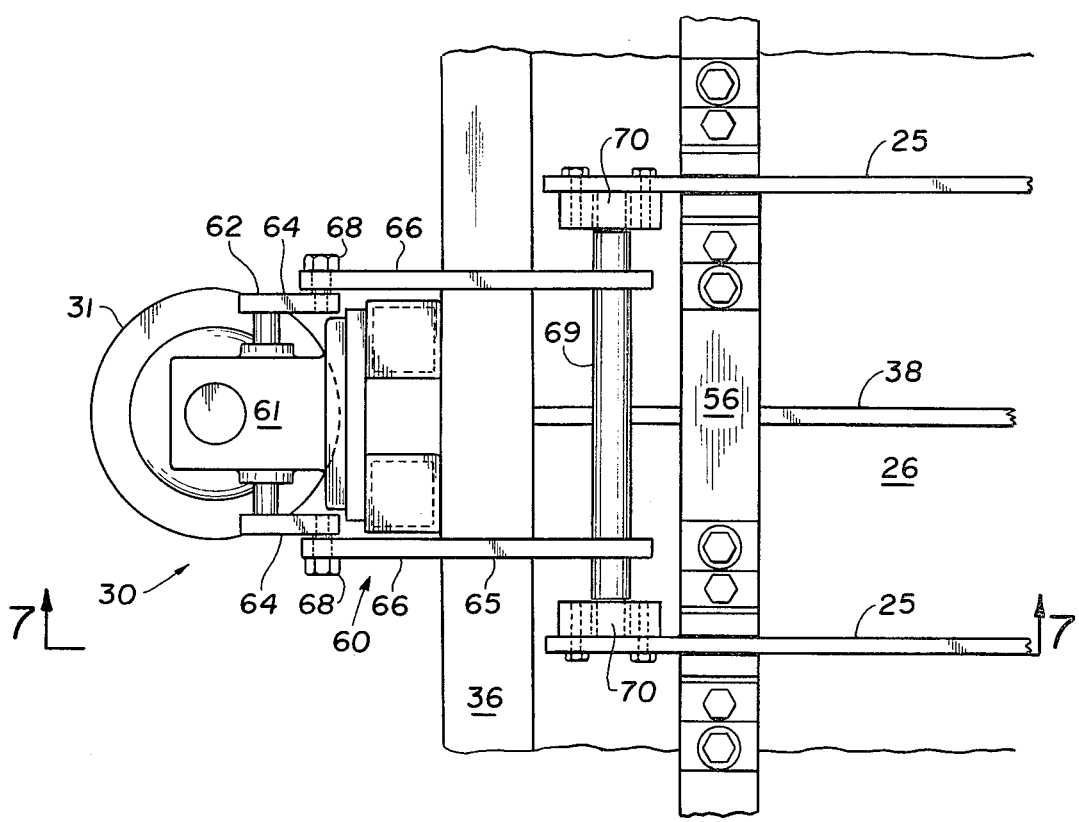
FIG. 6 is a partially broken top view of the drive assembly for the cathodes.
Figure 7:
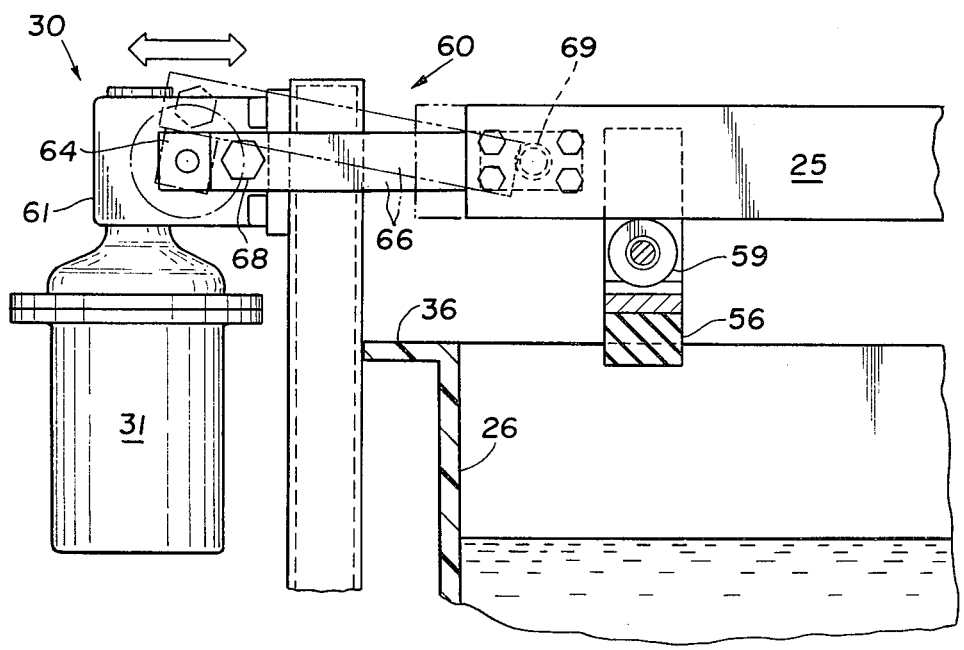
FIG. 7 is a front elevation of the drive assembly for the cathodes shown in essentially the same scale as FIG. 6, and taken along section line 7—7 of FIG. 6.

The oscillating linkage 60 is best shown in FIGS. 6 and 7. There it will be seen that the drive motor 31 is coupled to a speed reducer 61 which in turn actuates a crank assembly 62. The crank assembly includes a pair of crank arms 64, drive links 65, drive link arms 66, and a plurality of pins 68 securing the crank arm 64 to the drive link arms 66 The entire crank assembly 62 is coupled to cathode shaft 69 which in turn is secured to the cathode connector 70, being insulated connectors to the cathode bars 25 as shown. It will be appreciated that in the drawing FIG. 6, a pair of cathode bars straddling the center wall 38 of the tank 26 are shown. Where the unit is operated as a single cell, with a single rectifier, the cathode bars 25 are still activated by the oscillating drive assembly. It is desirable that at least a pair of cathode bars operate in order to maximize the utilization of the unit, but it will be appreciated that a single cathode bar in a single tank can less efficiently achieve the same result as the unit with two cathode bars 25. The electrical connections are diagrammatically shown in FIG. 1 where it will be seen that the cathode terminal 71 on the rectifier 15 leads out with a cathode lead 72 flexibly secured to the cathode bar 25.

Turning now to FIG. 9, it will be seen that the nozzles 55 on the spargers 50 include a nozzle block 75. An orifice 76 is provided in the nozzle block 75 and preferably a countersink 78 at the orifice outer end of the nozzle block 75. A deflector 80 is provided on each nozzle 55 generally parallel to the printed circuit board 20. As pointed out above, the nozzles and flow rates are designed in accordance with known diameters of orifice and flow rates to provide the most turbulent-free pattern. The patterns are staggered in footprints, however, particularly as shown in applicant's copending Pat. application No. 318,953 filed Nov. 6, 1981. In the present construction provision can also be optionally made in the joints 54 to which the spargers 50 are secured at their lowered ends so that selective angling of the sparger nozzles with the printed circuit board can be achieved.

In review, the method of the present invention is directed to reciprocating printed circuit boards while applying fluid through spargers angled with the boards at a minimum turbulence maximum mass transport rate. Flow rates in the range of 100 to 300 gallons per minute are achieved, with current densities of 50 to 200 amperes per square foot. Ideally the sparger nozzles are staggered on vertical centers, and positioned to flow in one direction on one side of the cell, and flow the opposite direction on the opposite side of the cell to avoid fluid build-up at one end of the cell. The plating achieved is substantially uniform, particularly as to the thickness plated within the holes in the printed circuit board and the plating on the face. In addition, unlike the competitive systems of the prior art, the subject system does not involve air agitation of the plating solution. In those systems where acid copper plating is employed with air for agitation, the air can act to increase oxidation of the additives, and increase the cost of operation. Moreover, air agitation increases fumes, corrosion, and operator safety problems.

In an alternative embodiment, utilizing essentially the same tank, spargers, and manifold system, the cathode bars need not be agitated where the anodes are side-by-side adjacent the two opposed walls of the tank. With the side-by-side arrangement of the anodes, and spargers positioned between the anodes and the printed circuit boards, the agitation by reciprocation can be omitted with good results.

What is claimed is:

1. An electrodeposition system including a cell comprising, in combination,
a plurality of uniformly longitudinally spaced vertical sparger tubes within the plating cell,
a plurality of anode bars positioned adjacent the spargers and a wall of the cell and remote from the central area,
a conductive cathode bar mounted for reciprocation above cell,
means for energizing said cathode bar,
clamp means for securing a printed circuit board in electrical communication and physical communication with and beneath said cathode bar,
means for reciprocating said cathode bar while a printed circuit board is in a plating solution interiorly of each of said plating cell,
and said means for reciprocating being restricted so that movement in substantially one-half the distance between the vertical spargers.

2. In the electrodeposition system, of claim 1 above, two parallel adjacent plating cells,
a cathode bar for and above each cell,
said reciprocating means being coupled to both cathode bars whereby the cathode bars reciprocate in parallel identical fashion.

3. In the electrodeposition system of claim 1, above
a wier at one end of said cell defining a sump,
pump means in fluid communication with the sump for recirculating plating solution through said spargers oriented vertically within the plating cell.

4. In the electrodeposition system of claim 2, above
independent rectifier means supplying current to each separate cell,
whereby the current may be varied from cell to cell in intensity and time.

5. The method of electrodeposition for a plurality of printed circuit boards comprising the steps of:
positioning said printed circuit boards in a longitudinal parallel plating solution cell,
providing for acute angle impingement of electroplating solution on said printed circuit boards in opposite directions on either sides of the boards, and
agitating said boards by means of reciprocating the same in longitudinal sequential fashion within the unit.

6. In the method of claim 5,
positioning vertical spargers in spaced relation to the printed circuit board with nozzles on each sparger,
staggering the nozzles on adjacent spargers at alternate vertical spacings.

7. An electrodeposition system including a cell comprising, in combination,
a plurality of uniformly longitudinally spaced vertical sparger tubes within the plating cell,
a plurality of anode bars positioned in closely spaced parallel relationship along the opposed side walls of the cell midway between the spargers,
a conductive cathode bar mounted above each cell for suspending the printed circuit bars,
means for energizing said cathode bar,
clamp means for securing a printed circuit board in electrical communication and physical communication with and beneath said cathode bar,
the spargers being oriented to have a plurality of nozzles on one side of the printed circuit board directed in one direction, and on the other side of the printed circuit board in the opposite direction,
the nozzles in each of said spargers being on vertically alternate spaced positions.

* * * * *